US010680139B2

(12) United States Patent
Ueda et al.

(10) Patent No.: US 10,680,139 B2
(45) Date of Patent: Jun. 9, 2020

(54) WINDOW MEMBER FOR OPTICAL DEVICE PACKAGE, OPTICAL DEVICE PACKAGE, MAKING METHODS, AND OPTICAL DEVICE-MOUNTABLE PACKAGE

(71) Applicant: Shin-Etsu Chemical Co., Ltd., Tokyo (JP)

(72) Inventors: Shuhei Ueda, Joetsu (JP); Masaki Takeuchi, Joetsu (JP); Harunobu Matsui, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/667,249

(22) Filed: Aug. 2, 2017

(65) Prior Publication Data
US 2018/0040778 A1    Feb. 8, 2018

(30) Foreign Application Priority Data

Aug. 3, 2016   (JP) .................. 2016-152518

(51) Int. Cl.
H01L 33/58  (2010.01)
H01L 33/48  (2010.01)
C03C 15/00  (2006.01)
C03C 19/00  (2006.01)

(52) U.S. Cl.
CPC .......... H01L 33/483 (2013.01); H01L 33/58 (2013.01); C03C 15/00 (2013.01); C03C 19/00 (2013.01); H01L 2924/16195 (2013.01); H01L 2933/0033 (2013.01); H01L 2933/0058 (2013.01); H01L 2933/0091 (2013.01)

(58) Field of Classification Search
None
See application file for complete search history.

(56) References Cited

U.S. PATENT DOCUMENTS

| 6,661,084 B1 * | 12/2003 | Peterson ............... H01L 25/105 257/680 |
| 7,847,307 B2 | 12/2010 | Nagai |
| 9,240,524 B2 * | 1/2016 | Park ..................... H01L 33/486 |
| 2008/0055882 A1 * | 3/2008 | Ueno ................... G02B 6/0016 362/23.12 |
| 2015/0260877 A1 | 9/2015 | Ueda et al. |

(Continued)

FOREIGN PATENT DOCUMENTS

| EP | 3001466 A1 | 3/2016 |
| JP | 2001-196644 A | 7/2001 |
| JP | 2006-173271 A | 6/2006 |

(Continued)

OTHER PUBLICATIONS

Extended European Search Report, dated Sep. 29, 2017, for European Application No. 17183746.1.

Primary Examiner — Fernando L Toledo
Assistant Examiner — Valerie N Newton
(74) Attorney, Agent, or Firm — Birch, Stewart, Kolasch & Birch, LLP

(57) ABSTRACT

An optical device package comprising a receptacle, an optical device received therein, and a window member disposed forward of the receptacle in a light emitting direction of the optical device. The window member is a member of synthetic quartz glass having front and back surfaces, at least one of the front and back surfaces being a rough surface.

22 Claims, 4 Drawing Sheets

(56) References Cited

U.S. PATENT DOCUMENTS

2016/0096776 A1    4/2016   Nomura et al.
2016/0181479 A1    6/2016   Kim et al.

FOREIGN PATENT DOCUMENTS

| JP | 2006-269678 A | 10/2006 |
|----|---------------|---------|
| JP | 2011-128290 A | 6/2011 |
| JP | 2013-187245 A | 9/2013 |
| KR | 10-0998473 B1 | 12/2010 |

* cited by examiner

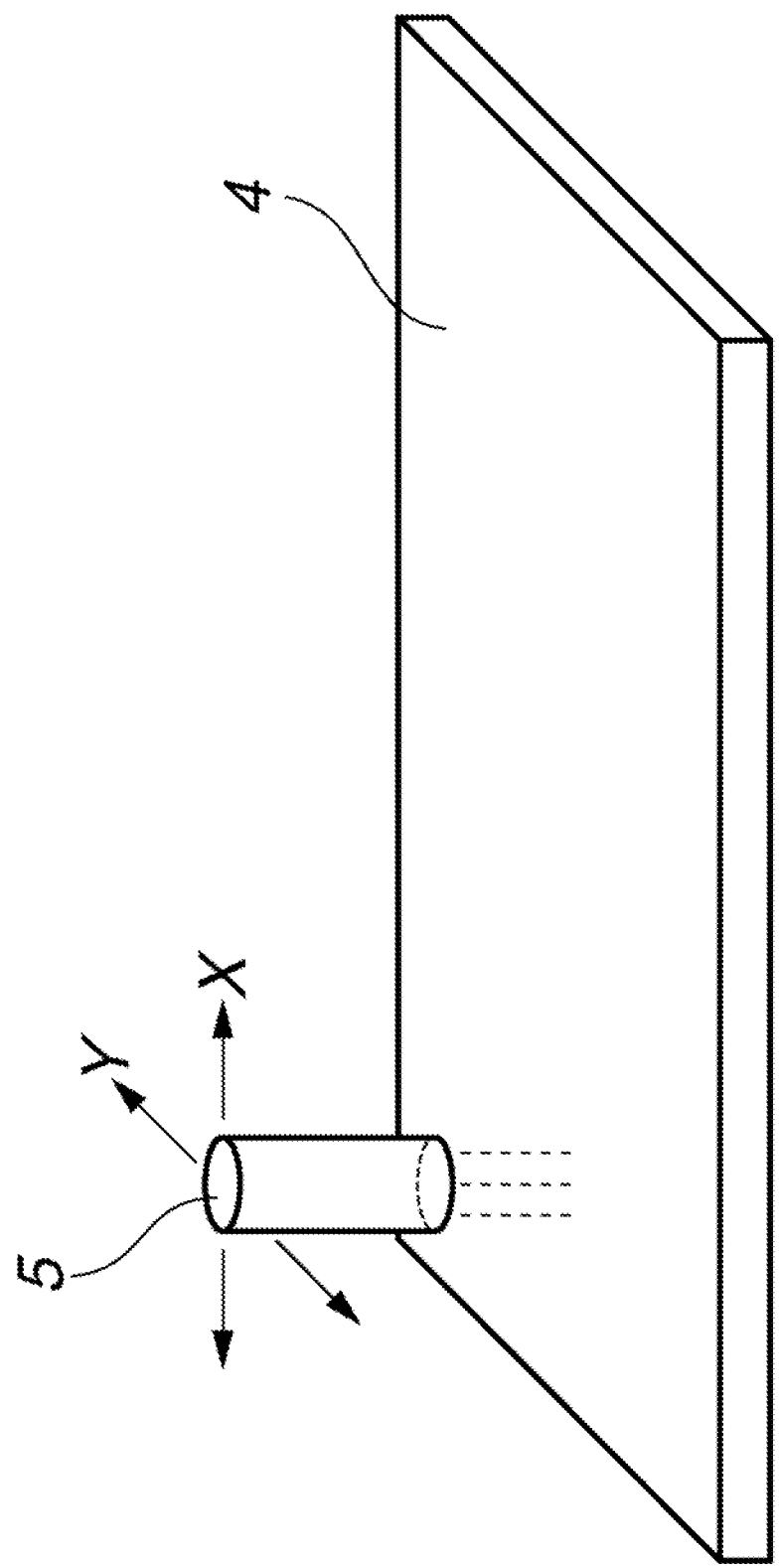

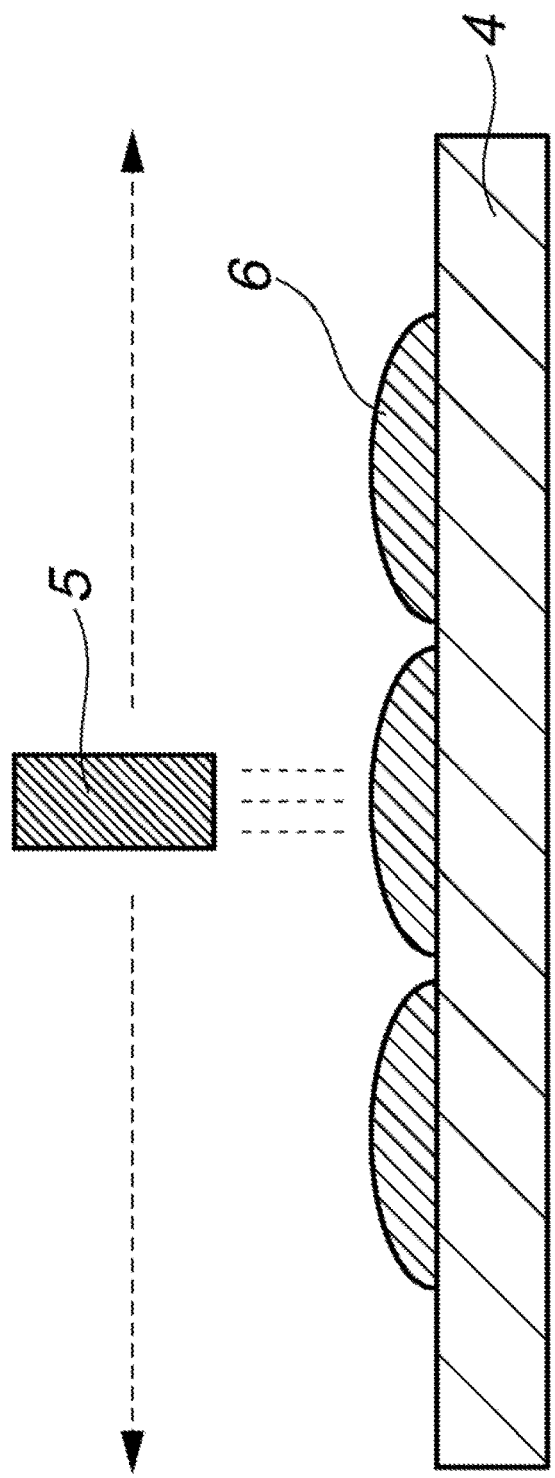

WINDOW MEMBER FOR OPTICAL DEVICE PACKAGE, OPTICAL DEVICE PACKAGE, MAKING METHODS, AND OPTICAL DEVICE-MOUNTABLE PACKAGE

CROSS-REFERENCE TO RELATED APPLICATION

This non-provisional application claims priority under 35 U.S.C. § 119(a) on Patent Application No. 2016-152518 filed in Japan on Aug. 3, 2016, the entire contents of which are hereby incorporated by reference.

TECHNICAL FIELD

This invention relates to window members for use in packages for optical devices such as UV-LEDs, laser light sources having an increased output of short wavelength light or the like, especially optical devices capable of emitting UV band light; optical device-mountable packages comprising the window members; optical device packages having an optical device mounted in a receptacle; and methods for preparing the window member and the optical device package.

BACKGROUND ART

While receptacles and window members are used in packaging LEDs, the window members must be made of materials having high transparency to light emitted by the LED. In the prior art, light-transmissive resins such as epoxy resins, silicone resins, modified acrylic resins and unsaturated polyester resins are used as the window members for LEDs (see Patent Document 1).

As the use of mercury lamps is recently regulated, UV-LEDs capable of emitting short wavelength light, especially UV band light are regarded promising as the replacement. While LEDs can produce light of arbitrary wavelength, LEDs of wavelength for a particular application are developed. For example, wavelength 265 nm in the UV region is known effective for sterilization. UV-LEDs adapted to emit light of wavelength 265 nm are developed for the sterilization application. Even when optical devices of 265 nm are in constant supply, it is difficult to use the optical devices without packages. It is thus required to package the UV-LED while maximizing the light extraction efficiency from the UV-LED.

In packaging of UV-LEDs, borosilicate glass and quartz glass are generally used as the window members (see Patent Document 2). When light-transmissive resins and borosilicate glass are used as the window member, there is the advantage of easy working, but the drawback of low UV transmittance. When quartz glass is used as the window member, there is the advantage of high UV transmittance, but the drawback of difficult working because of the high softening point of quartz glass. For all these materials, mirror finishing of their surface is effective for enhancing the extraction efficiency of light. Once the window member is mirror finished, however, the window member fails to scatter light from an optical device featuring directional emission. For light scattering purpose, a separate member such as diffusing filter is necessary.

CITATION LIST

Patent Document 1: JP-A 2001-196644
Patent Document 2: JP-A 2006-269678

SUMMARY OF INVENTION

An object of the invention is to provide a window member for use in an optical device package, having a high transmittance, the window member being capable of scattering light from a light-emitting device to achieve a wide-angle light distribution, without reducing the transmission efficiency of light through the window member, especially the extraction efficiency of light from the light-emitting device. Another object is to provide an optical device-mountable package comprising the window member, an optical device package having an optical device within a receptacle, and methods for preparing the optical device-mountable package and the optical device package.

The invention pertains to an optical device package comprising a receptacle, an optical device received therein having a light emitting direction, and a window member disposed forward of the receptacle in the light emitting direction. The inventors have found that when a member of synthetic quartz glass having front and back surfaces, at least one of which is a rough surface, specifically having a surface roughness (Ra) of 0.1 to 0.5 μm is used as the window member, this window member offers a high transmittance by virtue of high transmission of synthetic quartz glass without a need for mirror finishing of the window member, and can scatter light from a light-emitting device to achieve a wide-angle light distribution, without reducing the transmission efficiency of light through the window member, especially the extraction efficiency of light from the light-emitting device. The window member for the optical device package may be prepared, when the window member is of planar shape, by lapping or sand blasting at least one of front and back surfaces of a planar shape synthetic quartz glass member, and etching the lapped or sand blasted surface into the rough surface; or when the window member is of convex shape, by attaching a stereo-mask of convex shape to one surface of a planar shape synthetic quartz glass member, sand blasting the one surface of synthetic quartz glass together with the mask, for transferring the convex shape of the mask to the synthetic quartz glass, and etching the sand blasted surface into the rough surface. The invention is predicated on these findings.

Accordingly, in one aspect, the invention provides a window member to be combined with a receptacle having received therein an optical device having a light emitting direction, the window member being disposed forward of the receptacle in the light emitting direction, the window member being a member of synthetic quartz glass having front and back surfaces, at least one of which is a rough surface.

Specifically, the rough surface has a surface roughness (Ra) of 0.1 to 0.5 μm.

In one preferred embodiment, the window member is of planar shape. The window member has a thickness of 0.1 to 5 mm.

In another preferred embodiment, the window member is of convex shape. The window member includes a thinnest portion having a thickness of 0.1 to 5 mm and a thickest portion having a thickness of 0.4 to 9.9 mm. The convex shape is preferably a partial spherical or partial ellipsoidal shape, the convex shape surface having a radius of curvature of 0.5 to 30 mm.

In another aspect, the invention provides an optical device-mountable package comprising a receptacle adapted to receive an optical device therein, and the planar shape window member defined above; or an optical device-mountable package comprising a receptacle adapted to receive an optical device therein, and the convex shape window member define above.

In a further aspect, the invention provides an optical device package comprising the optical device-mountable package having the planar shape window member, and an optical device received within the receptacle; or an optical device package comprising the optical device-mountable package having the convex shape window member, and an optical device received within the receptacle.

Typically, the optical device is a light-emitting device, more preferably capable of emitting light of wavelength up to 300 nm.

In a still further aspect, the invention provides a method for preparing the planar shape window member defined above for an optical device package, comprising the steps of:

lapping or sand blasting at least one of front and back surfaces of a planar shape synthetic quartz glass member, and etching the lapped or sand blasted surface into the rough surface.

In a still further aspect, the invention provides a method for preparing the convex shape window member defined above for an optical device package, comprising the steps of:

attaching a stereo-mask of convex shape to one surface of a planar shape synthetic quartz glass member, sand blasting the one surface of synthetic quartz glass together with the mask, for transferring the convex shape of the mask to the synthetic quartz glass, and etching the sand blasted surface into the rough surface.

In a still further aspect, the invention provides a method for preparing an optical device package comprising the planar shape window member, the method comprising the steps of:

lapping or sand blasting at least one of front and back surfaces of a planar shape synthetic quartz glass member, etching the lapped or sand blasted surface into the rough surface for yielding the window member, mounting an optical device within a receptacle, and integrating the window member with the receptacle.

In a still further aspect, the invention provides a method for preparing an optical device package comprising the convex shape window member, the method comprising the steps of:

attaching a stereo-mask of convex shape to one surface of a planar shape synthetic quartz glass member, sand blasting the one surface of synthetic quartz glass together with the mask, for transferring the convex shape of the mask to the synthetic quartz glass, etching the sand blasted surface into the rough surface for yielding the window member, mounting an optical device within a receptacle, and integrating the window member with the receptacle.

Typically, the optical device is a light-emitting device, more preferably capable of emitting light of wavelength up to 300 nm.

Advantageous Effects of Invention

The window member can radiate light transmitted by the window member, especially emergent light originating from a light-emitting device and transmitted by the window member, from the emergent surface over a wide angle, while maintaining substantially the same radiant flux as the conventional window member having both front and back surfaces mirror finished. An optical device-mountable package and an optical device package, comprising the window member, are also available.

BRIEF DESCRIPTION OF DRAWINGS

FIG. 3 is a schematic perspective view illustrating a sand blasting step in the window member preparing method.

FIGS. 4(A) and 4(B) are cross-sectional views for illustrating the step of transferring a convex shape to synthetic quartz glass, FIG. 4(A) illustrating the step of sand blasting the starting substrate with a stereo-mask attached thereto, and FIG. 4(B) illustrating the convex shape transferred to the substrate.

DESCRIPTION OF PREFERRED
EMBODIMENTS

The optical device-mountable package of the invention is used for receiving and protecting an optical device and rendering the handling of the optical device easy, and comprises a receptacle adapted to receive the optical device therein and a window member of synthetic quartz glass disposed forward of the receptacle in a light emitting direction of the optical device.

The window member has front and back surfaces, at least one of which is a rough surface. That is, only the front surface is a rough surface, only the back surface is a rough surface, or both the front and back surfaces are rough surfaces. The two surfaces, front and back surfaces are assigned to two surfaces with which light intersects when light emitted by the optical device or light to be received by the optical device is transmitted by the window member. Although at least one of front and back surfaces is a rough surface, the window member has an equivalent radiant flux to a window member having both front and back surfaces which are mirror surfaces and acts to scatter light so that light emerges therefrom over a wide angle. As used herein, the term "rough surface" refers to a surface having a surface roughness, specifically arithmetic mean roughness Ra of preferably at least 0.1 µm, more preferably at least 0.2 µm, and preferably up to 0.5 µm, more preferably up to 0.4 µm. Where only one of front and back surfaces of a window member is a rough surface, the other surface is preferably a mirror surface. As used herein, the term "mirror surface" refers to a surface having a surface roughness, specifically arithmetic mean roughness Ra of preferably up to 0.05 µm, especially up to 0.03 µm.

Figure 1A:
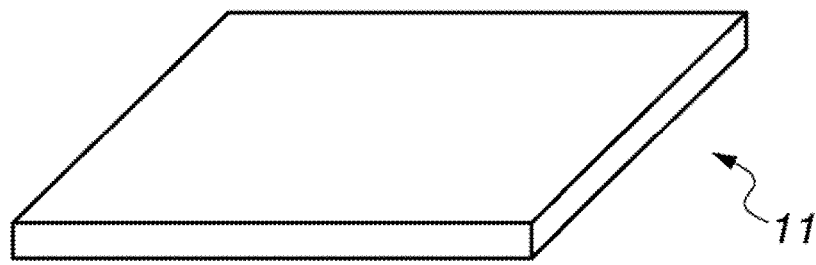
FIGS. 1(A), 1(B) and 1(C) illustrate a window member, an optical device-mountable package, and an optical device package in one embodiment of the invention, FIG. 1(A) being a perspective view of a planar shape window member, FIG. 1(B) being a cross-sectional view of the optical device-mountable package not received an optical device, and FIG. 1(C) being a cross-sectional view of the optical device package received an optical device.
Figure 2A:
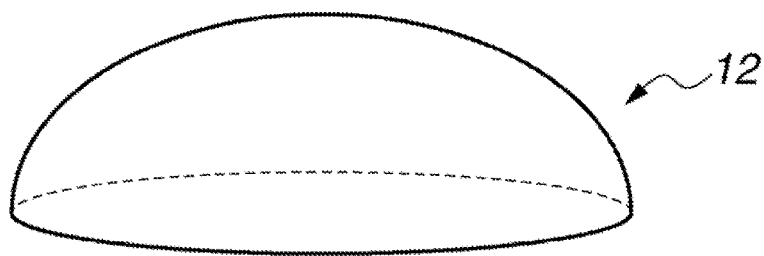
FIGS. 2(A), 2(B) and 2(C) illustrate a window member, an optical device-mountable package, and an optical device package in another embodiment of the invention, FIG. 2(A) being a perspective view of a convex shape window member, FIG. 2(B) being a cross-sectional view of the optical device-mountable package, and FIG. 2(C) being a cross-sectional view of the optical device package.

With respect to the shape of the window member, a window member 11 of planar shape as shown in FIG. 1(A), and a window member 12 of convex shape as shown in FIG. 2(A) are exemplary. The window members of planar shape include window members of plate, rectangular parallelepiped and cubic shape. The window members of convex shape include window members having in part or in entirety a partial spherical shape, e.g., semispherical shape, partial ellipsoidal shape, e.g., semi-ellipsoidal shape, or convex shape, e.g., conical, frusto-conical, pyramidal, or frusto-pyramidal shape. For example, it suffices that one of front and back surfaces of a window member is of convex shape, while the other surface may be of convex, planar or concave shape. Where a window member is of a partial spherical shape (e.g. semispherical shape) or partial ellipsoidal shape (e.g., semi-ellipsoidal shape), the convex shape surface preferably has a radius of curvature of 0.5 to 30 mm.

Figure 1B:
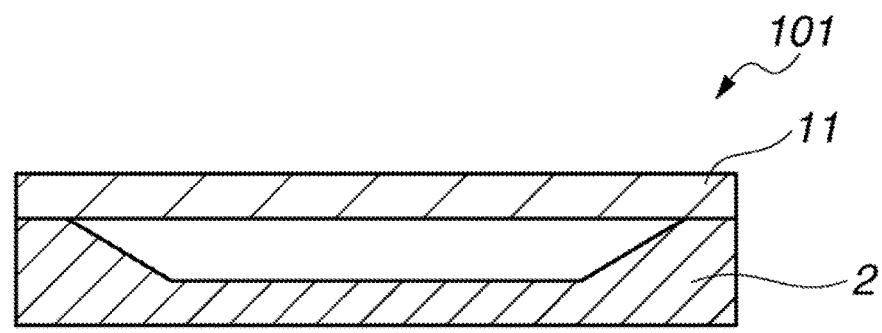
Figure 2B:
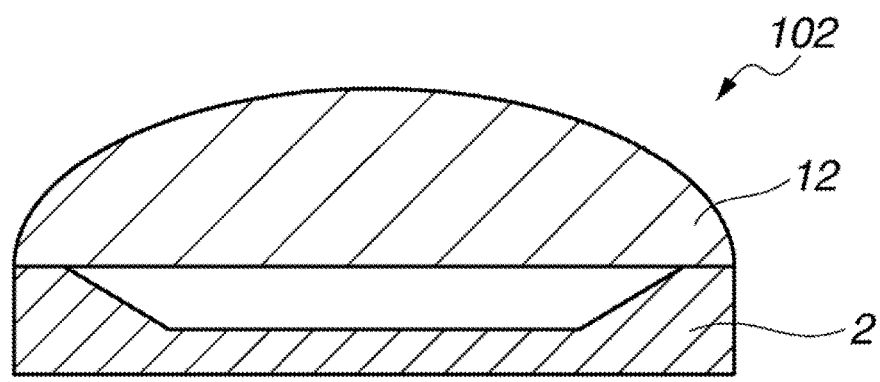

Embodiments of the window member and the optical device-mountable package include, for example, an optical device-mountable package 101 comprising a receptacle 2 adapted to receive an optical device therein and a planar shape window member 11 as shown in FIG. 1(B) and an optical device-mountable package 102 comprising a receptacle 2 adapted to receive an optical device therein and a convex shape window member 12 as shown in FIG. 2(B).

The invention further provides an optical device package comprising the optical device-mountable package having an optical device received within the receptacle. The optical device package may be either a light-emitting device package having a light-emitting device or a light-receiving device package having a light-receiving device, with the light-emitting device package being preferred.

Figure 1C:
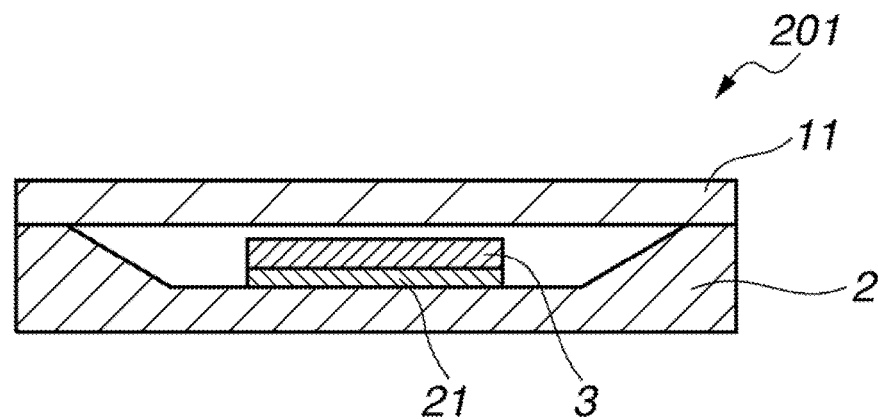
Figure 2C:
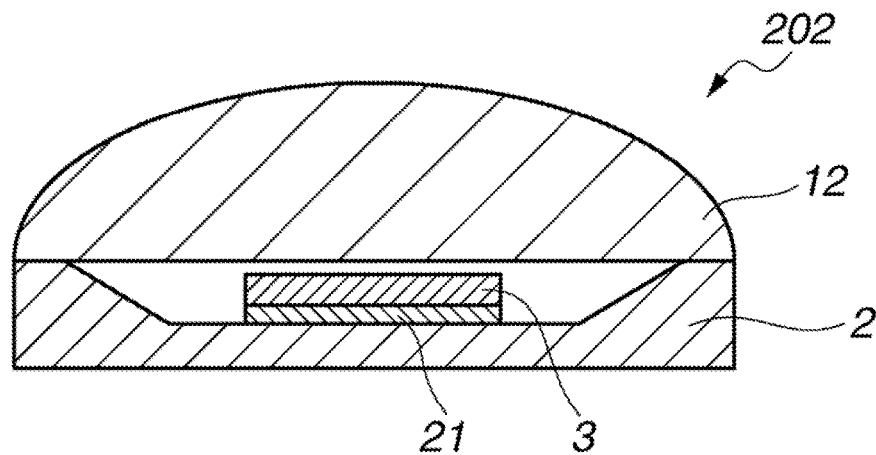

Embodiments of the light-emitting device package include, for example, where the optical device-mountable package 101 in FIG. 1(B) is used, a light-emitting device package 201 comprising an optical device-mountable package comprising a receptacle 2 adapted to receive an optical device therein and a planar shape window member 11, and an optical device 3 rested on an interior surface (the bottom in the figure) of the receptacle 2 via a heat sink 21 as shown in FIG. 1(C); and where the optical device-mountable package 102 in FIG. 2(B) is used, a light-emitting device package 202 comprising an optical device-mountable package comprising a receptacle 2 adapted to receive an optical device therein and a convex shape window member 12, and an optical device 3 rested on an interior surface (the bottom in the figure) of the receptacle 2 via a heat sink 21 as shown in FIG. 2(C).

The receptacle and the window member define a cavity where not only the optical device, but also other members such as leads for providing electric conduction between the optical device and the package exterior may be disposed. The remaining cavity may be kept in vacuum, filled with a gas such as air, or sealed with a transparent solid encapsulant such as rubber, elastomer or resin. It is preferred from the aspect of dissipating the heat from the optical device that the cavity be kept in vacuum or filled with a gas such as air, rather than being sealed with the solid encapsulant.

The window member is preferably adapted to tightly close the receptacle cavity. The size of the window member is selected as appropriate depending on a particular application of the optical device, and the size of the optical device and other members to be received. It is preferred from the aspect of tight seal that the size of the window member is equal to or slightly greater than the size of the opening of the optical device-receiving cavity of the receptacle. Specifically, the length of diagonal when the window member is rectangular in planar shape, or the diameter or maximum diameter when the window member is circular or elliptic in planar shape is preferably at least 1 mm, more preferably at least 2 mm and up to 30 mm, more preferably up to 20 mm.

The thickness of the window member is selected as appropriate depending on a pressure (pneumatic or hydraulic pressure) difference from the outside of the window member, that is, the outside of the optical device-mountable package. In the case of the window member of planar shape, it is preferred from the aspect of strength that the thickness be at least 0.1 mm, more preferably at least 0.2 mm and up to 5 mm, more preferably up to 4 mm. In the case of the window member of convex shape, it is preferred from the aspect of strength that the thickness of the thinnest portion be at least 0.1 mm, more preferably at least 0.2 mm and up to 5 mm, more preferably up to 4 mm, and the thickness of the thickest portion be at least 0.4 mm and up to 9.9 mm.

The receptacle may be any of well-known receptacles adapted to receive the optical device therein in optical device-mountable packages. Use may be made of any receptacles formed of inorganic materials such as metals and ceramics or organic materials such as rubbers, elastomers and resins and having a recess or cavity for receiving the optical device. The size of the receptacle is selected as appropriate depending on a particular application of the optical device, and the size of the optical device to be received and the window member. If the optical device reaches a high-temperature state by its own heat release, as prominent with LEDs, then the optical device loses its emission efficiency. In such a situation, the receptacle is preferably formed of heat-dissipating ceramic materials such as alumina and alumina nitride-based ceramic materials, which are optionally coated with metal plating such as gold or copper as a heat transfer layer.

The optical device to be disposed in the receptacle cavity may be either a light-emitting device or a light-receiving device, with the light-emitting device being preferred. The window member, the optical device-mountable package comprising the window member, and the optical device package according to different embodiments of the invention are preferable for use with the light-emitting device capable of emitting light of wavelength 300 nm or shorter. Examples of the light-emitting device include UV-LED (e.g., including light of wavelength 300 nm or shorter, with peak wavelength of 250 to 280 nm), ArF excimer laser (wavelength 193 nm), KrF excimer laser (wavelength 248 nm), YAG, and FHG (fourth harmonic generation) laser (wavelength 266 nm).

The window member may be prepared, for example, by the following method. The starting substrate is preferably selected from planar substrates, for example, rectangular substrates with a diagonal length of 100 to 300 mm, and circular substrates with a diameter of 100 to 300 mm, both having a thickness of 0.5 to 10 mm.

Where the window member is of planar shape, one or both of front and back surfaces of the starting substrate are lapped or sand blasted. In the case of lapping, one or both surfaces are lapped on a single or double-side lapping machine using abrasive grains having a grain size of #800 to #1500 (average particle size 20 to 12 μm), more preferably #1000 to #1200 (average particle size 18 to 15 μm), yielding roughly polished surfaces having a surface roughness in a predetermined range, for example, arithmetic average roughness (Ra) of at least 0.08 μm, especially at least 0.11 μm, and up to 0.3 μm, especially up to 0.27 μm. Although the abrasive grains used for lapping are not particularly limited, alumina-based abrasive grains are preferred. In the case of lapping, only one surface is lapped, and the thus roughly polished surface is on the side where a rough surface of a window member is to be formed; or two surfaces are lapped one by one, and one or both of the roughly polished surfaces are on the side where a rough surface of a window member is to be formed; or both surfaces are simultaneously lapped, and one or both of the roughly polished surfaces are on the side where a rough surface of a window member is to be formed.

In the case of sand blasting, as shown in FIG. 3, for example, one surface of a starting substrate 4 to be polished is polished by using abrasive grains having a grain size of #600 to #3000 (average particle size 30 to 6 μm), and moving a sand blast nozzle 5 of a tool in horizontal X and Y directions, thereby forming a roughly polished surface. Although the abrasive grains used for sand blasting are not particularly limited, abrasive grains of cerium oxide, silicon oxide, aluminum oxide, and silicon carbide are preferred. In the case of sand blasting, abrasive grain-carrying air stream is injected from the sand blast nozzle against a surface to be polished, yielding a roughly polished surface having a surface roughness in a predetermined range, for example, arithmetic average roughness (Ra) of at least 0.1 μm, especially at least 0.12 μm, and up to 0.3 μm, especially up to 0.28 μm. In this case, the moving direction and speed of the sand blast nozzle, and air pressure are adjusted, for example, by computer control so that the resultant roughly polished surface may have a predetermined surface roughness. In the case of sand blasting, only one surface is polished, and the roughly polished surface is on the side where a rough surface of a window member is to be formed; or two surfaces are polished one by one, and one or both of the roughly polished surfaces are on the side where a rough surface of a window member is to be formed.

Where the window member is of convex shape, first one of front and back surfaces of a starting substrate is sand blasted. At this point, a stereo-mask of convex shape is attached to one surface of a synthetic quartz glass plate, and the one surface of glass plate bearing the stereo-mask is sand blasted along with the stereo-mask, for thereby transferring the convex shape of the stereo-mask to the glass plate and polishing the one surface into a roughly polished surface. The means for transferring the convex shape to synthetic quartz glass is illustrated below. As shown in FIG. 4(A), for example, a stereo-mask 6 is attached to one surface of a starting substrate 4, with a brittle fracture-susceptible or low elasticity adhesive such as silica-based adhesive, ceramic adhesive or cement, before abrasive grain-carrying air stream is injected from a sand blast nozzle 5 against the surface to be polished, accomplishing sand blasting. The use of the stereo-mask means that polishing immediately starts on the portion of the starting substrate not covered with the stereo-mask. On the other hand, the stereo-mask is gradually abraded by sand blasting, the stereo-mask is vanished in order from a thin portion, and polishing on the starting substrate is started in order from the vanished portion of the stereo-mask. In this way, the onset of processing of the starting substrate differs depending on a difference in thickness of the stereo-mask, whereby the convex shape is transferred to the starting substrate 4 as shown in FIG. 4(B). The material of which the stereo-mask is made is not particularly limited as long as the material can be abraded away by sand blasting. Among others, brittle materials such as ceramics and glass are preferable.

The sand blasting may be performed by using abrasive grains preferably having a grain size of #600 to #3000 (average particle size 30 to 6 μm), and operating a tool so as to move a sand blast nozzle in X and Y directions on a surface of a starting substrate to be polished, like the sand blasting of a window member of planar shape, for thereby transferring the convex shape of the stereo-mask to synthetic quartz glass and polishing one surface into a roughly polished surface. Although the abrasive grains used for sand blasting are not particularly limited, abrasive grains of cerium oxide, silicon oxide, aluminum oxide, and silicon carbide are preferred. In the case of sand blasting, abrasive grain-carrying air stream is injected from a sand blast nozzle against a surface to be polished, yielding a roughly polished surface having a surface roughness in a predetermined range, for example, arithmetic average roughness (Ra) of at least 0.1 μm, especially at least 0.12 μm, and up to 0.3 μm, especially up to 0.28 μm. In this case, the moving direction and speed of the sand blast nozzle, and air pressure are adjusted, for example, by computer control so that the resultant roughly polished surface may have a predetermined surface roughness. Meanwhile, the other surface may be lapped or sand blasted, depending on its shape, before or after the one surface is given the convex shape, preferably before the one surface is given the convex shape. Where the other surface is planar, this surface may be processed by the same method as the lapping and sand blasting of the window member of planar shape, thereby forming a polished surface.

Before or after the lapping or sand blasting, or after etching (to be described later), the starting substrate may be cut to a predetermined shape and size, for example, to a predetermined shape as shown in FIG. 1(A) or FIG. 2(A) by machining with water jet or machining with laser light such as $CO_2$ laser or YAG laser, if necessary, when a plurality of window members' are cut out of a single starting substrate as shown in FIG. 4(B), or an extra portion is cut away so as to comply with a predetermined size. For example, by irradiating laser light to a starting substrate, scanning the light in a rectangular or circular pattern, and removing the irradiated portion, a horizontal shape may be processed to a rectangular or circular shape.

Independent of whether the window member is of planar shape or of convex shape, a method of sand blasting one surface into a polished surface and lapping the other surface into a polished surface may be used. Also independent of whether the window member is of planar or convex shape, the surface not to become a rough surface in the window member may be a mirror surface, for example, the surface is preferably converted to a mirror surface after lapping or sand blasting. The mirror surface may be formed by mirror finishing in a well-known manner before or after etching (to be described later), preferably after etching.

Next, the lapped or sand blasted surface, that is, the roughly polished surface thus formed is etched, yielding a rough surface in the window member. The surface after the lapping or sand blasting is in a very rough state as machined, and as such, is less light transmissive, failing to provide an equivalent light transmission to a mirror surface. By further etching the roughly polished surface thus formed, the roughly polished surface may be converted to a rough surface where a collection of dimples like microscopic concave lenses having a diameter of several microns, specifically 2 to 20 μm is distributed. There is obtained a window member capable of light scattering and having an energy quantity of light from the emergent surface, i.e., radiant flux which is approximately equal to that of a window member whose surfaces are both mirror surfaces. In the case of a window member of planar shape, only the front surface, only the back surface, or both the front and back surfaces may be rough surfaces; in the case of a window member of convex shape, only one surface of convex shape or one surface of convex shape and the other surface are preferably rough surfaces.

Etching may be performed by using an etchant (liquid) capable of etching synthetic quartz glass and bringing the etchant in contact with the roughly polished surface, for example, immersing the roughly polished surface of the starting substrate in the etchant. Although the etchant used herein is not particularly limited, hydrofluoric acid aqueous solutions are preferred. Examples include 5 to 25 wt % hydrofluoric acid aqueous solutions and buffered hydrofluoric acid aqueous solutions which are mixtures of 5 to 40 wt % ammonium fluoride and 5 to 25 wt % hydrogen fluoride. Although the etching conditions are not particularly limited, the etching temperature is typically 15 to 23° C. and the etching time is typically 1 to 10 minutes.

The optical device package may be prepared by furnishing a window member, typically by the above-mentioned method, mounting an optical device in the cavity of a receptacle, typically on the bottom of the receptacle cavity, and attaching the window member to the receptacle, typically by adhesive bonding, for thereby integrating them. With respect to the integration of the window member to the receptacle, the tightness of the contact area between the window member and the receptacle is critical. Thus in a preferred procedure, a thin film of chromium or the like is deposited on the contact area of the window member, and a gold-tin alloy paste (e.g., Au-22 wt % Sn by Mitsubishi Material Co., Ltd.), low-melting metallic glass (e.g., VS-1302T by Hitachi Chemical Co., Ltd.) or lead-free solder (e.g., ECO SOLDER® M705 by Senju Metal Industry Co., Ltd.) is applied thereon, typically by screen printing before the window member is bonded to the receptacle.

EXAMPLE

Examples of the invention are given below by way of illustration and not by way of limitation.

Example 1

A starting synthetic quartz glass substrate (diameter 8 inches=20.32 cm, thickness 1 mm) as sliced was lapped on both front and back surfaces on a double-side lapping machine with alumina abrasive of grain size #1000 (average particle size 18 µm), until both the front and back surfaces became roughly polished surfaces.

The starting substrate was then etched on both the surfaces by immersing it in a 10 wt % hydrofluoric acid aqueous solution at 20° C. for 5 minutes. The substrate was then cut into pieces of 3.5 mm squares by a dicing saw, yielding a window member of planar shape whose front and back surfaces were both rough surfaces and having a thickness of 0.3 mm. This window member had a surface roughness (Ra) of 0.25 µm on the front surface and a surface roughness (Ra) of 0.25 µm on the back surface.

There was furnished a receptacle of alumina-based ceramic material having a cavity. A light-emitting device (LED) capable of emitting UV light including light of wavelength 285 nm was rested on the receptacle bottom and received in the receptacle cavity. To a peripheral portion of the window member to be bonded to the receptacle, a chromium film was deposited by sputtering, and a gold-tin alloy paste (Au-22 wt % Sn, Mitsubishi Material Co., Ltd.) was applied by screen printing. The window member was bonded to the receptacle, completing an optical device package.

The light emitting device in the package was burnt to evaluate emissive characteristics. Light emerging out of the window member had a radiant flux of 5 mW. Analysis of luminous intensity distribution gave a half beam angle of 120°.

Example 2

A starting synthetic quartz glass substrate (diameter 8 inches, thickness 1 mm) as sliced was lapped on both front and back surfaces as in Example 1, until both the front and back surfaces became roughly polished surfaces. The substrate was then etched on both the surfaces as in Example 1. The back surface was polished on a single-side polishing machine into a mirror surface. The substrate was then cut into pieces of 3.5 mm squares by a dicing saw, yielding a window member of planar shape whose front surface was a rough surface and back surface was a mirror surface and having a thickness of 0.3 mm. This window member had a surface roughness (Ra) of 0.26 µm on the front surface and a surface roughness (Ra) of 0.01 µm on the back surface.

As in Example 1, an optical device package was completed. As in Example 1, emissive characteristics and luminous intensity distribution were evaluated. Light emerging out of the window member had a radiant flux of 5 mW and a half beam angle of 120°.

Example 3

A starting synthetic quartz glass substrate (diameter 8 inches, thickness 3 mm) as sliced was lapped on both front and back surfaces as in Example 1, until both the front and back surfaces became roughly polished surfaces. A stereo-mask having a matrix of pyramidal protrusions of alumina ceramic of 3.5 mm squares and height 2 mm arranged was attached to one surface of the starting substrate with sodium silicate adhesive, before the one surface along with the stereo-mask was sand blasted with alumina abrasive of grain size #600 (average particle size 30 µm), for thereby transferring the pyramidal shape to the substrate and polishing the surface into a roughly polished surface. Using a dicing saw, the substrate was then cut into pieces of 3.5 mm squares each aligned with the pyramidal shape portion.

The substrate was then etched on both the surfaces by immersing it in a 10 wt % hydrofluoric acid aqueous solution at 20° C. for 5 minutes, yielding a window member of convex shape whose front and back surfaces were both rough surfaces and including the thinnest portion having a thickness of 0.25 mm and the thickest portion having a thickness of 2 mm. This window member had a surface roughness (Ra) of 0.27 µm on the front surface and a surface roughness (Ra) of 0.27 µm on the back surface.

As in Example 1, an optical device package was completed. As in Example 1, emissive characteristics and luminous intensity distribution were evaluated. Light emerging out of the window member had a radiant flux of 5 mW and a half beam angle of 125°.

Example 4

A quartz glass substrate was processed as in Example 3 except that a stereo-mask having a matrix of semi-spherical protrusions of alumina ceramic of diameter 3.5 mm and height 2 mm arranged on a ceramic plate was used, and the substrate was cut into pieces of diameter 3.5 mm each aligned with the semi-spherical shape portion by means of a $CO_2$ laser tool. There was obtained a window member of convex shape whose front and back surfaces were both rough surfaces and including the thinnest portion having a thickness of 0.13 mm and the thickest portion having a thickness of 2 mm. This window member had a surface roughness (Ra) of 0.27 µm on the front surface and a surface roughness (Ra) of 0.27 µm on the back surface. The convex shape surface of the semispherical shape window member had a radius of curvature of 1.75 mm.

As in Example 1, an optical device package was completed. As in Example 1, emissive characteristics and luminous intensity distribution were evaluated. Light emerging out of the window member had a radiant flux of 5 mW and a half beam angle of 140°.

Example 5

A quartz glass substrate was processed as in Example 3 except that a stereo-mask having a matrix of semi-spherical protrusions of alumina ceramic of diameter 3.5 mm, height 3 mm and radius of curvature 1.7 mm arranged on a ceramic plate was used, and the substrate was cut into pieces of diameter 3.5 mm each aligned with the semi-spherical shape portion by means of a $CO_2$ laser tool. There was obtained a window member of convex shape whose front and back surfaces were both rough surfaces and including the thinnest portion having a thickness of 0.25 mm and the thickest portion having a thickness of 3 mm. This window member had a surface roughness (Ra) of 0.27 µm on the front surface and a surface roughness (Ra) of 0.27 µm on the back surface. The convex shape surface of the semispherical shape window member had a radius of curvature of 1.75 mm.

As in Example 1, an optical device package was completed. As in Example 1, emissive characteristics and luminous intensity distribution were evaluated. Light emerging out of the window member had a radiant flux of 5 mW and a half beam angle of 140°.

Comparative Example 1

A starting synthetic quartz glass substrate (diameter 8 inches, thickness 1.2 mm) as sliced was lapped on both front and back surfaces as in Example 1, until both the front and back surfaces became roughly polished surfaces. The front and back surfaces of the substrate were then polished on a double-side polishing machine into mirror surfaces. The substrate was then cut into pieces of 3.5 mm squares by a dicing saw, yielding a window member of planar shape whose front and back surfaces were mirror surfaces and having a thickness of 1 mm. This window member had a surface roughness (Ra) of 0.01 µm on the front surface and a surface roughness (Ra) of 0.01 µm on the back surface.

As in Example 1, an optical device package was completed. As in Example 1, emissive characteristics and luminous intensity distribution were evaluated. Light output from the window member had a radiant flux of 5 mW and a half beam angle of 105°.

A comparison of the optical device package in Example comprising a window member in which one or both of front and back surfaces are rough with the optical device package in Comparative Example comprising a window member in which both front and back surfaces are mirror surfaces reveals that they are equivalent in radiant flux, but the half beam angle of Example is greater than that of Comparative Example, indicating reduced directivity of light emission. The window member according to the invention radiates light from the emergent surface over a wide angle, while maintaining substantially the same radiant flux as the comparative window member having both front and back surfaces mirror finished.

Japanese Patent Application No. 2016-152518 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A window member to be combined with a receptacle having received therein an optical device having a light emitting direction,
    the window member being disposed forward of the receptacle in the light emitting direction,
    the window member being a member of synthetic quartz glass having front and back surfaces, at least one of which is a rough surface formed of a collection of dimples of microscopic concave lenses having a diameter of 2 to 20 µm.

2. The window member of claim 1 wherein the rough surface has a surface roughness (Ra) of 0.1 to 0.5 µm.

3. The window member of claim 1 which is of planar shape.

4. The window member of claim 3, having a thickness of 0.1 to 5 mm.

5. The window member of claim 1 which is of convex shape.

6. The window member of claim 5, including a thinnest portion having a thickness of 0.1 to 5 mm and a thickest portion having a thickness of 0.4 to 9.9 mm.

7. The window member of claim 5 wherein the convex shape is a partial spherical or partial ellipsoidal shape, the convex shape surface having a radius of curvature of 0.5 to 30 mm.

8. An optical device-mountable package comprising a receptacle adapted to receive an optical device therein, and the planar shape window member of claim 3.

9. An optical device-mountable package comprising a receptacle adapted to receive an optical device therein, and the convex shape window member of claim 5.

10. An optical device package comprising the package of claim 8 having the planar shape window member, and an optical device received within the receptacle.

11. An optical device package comprising the package of claim 9 having the convex shape window member, and an optical device received within the receptacle.

12. The optical device package of claim 10 wherein the optical device is a light emitting device.

13. The optical device package of claim 12 wherein the optical device emits light of wavelength up to 300 nm.

14. A method for preparing the planar shape window member of claim 3 for an optical device package, comprising the steps of:
    lapping or sand blasting at least one of front and back surfaces of a planar shape synthetic quartz glass member, and
    etching the lapped or sand blasted surface into the rough surface.

15. A method for preparing the convex shape window member of claim 5 for an optical device package, comprising the steps of:
    attaching a stereo-mask of convex shape to one surface of a planar shape synthetic quartz glass member,
    sand blasting the one surface of synthetic quartz glass together with the mask, for transferring the convex shape of the mask to the synthetic quartz glass, and
    etching the sand blasted surface into the rough surface.

16. A method for preparing an optical device package comprising the planar shape window member of claim 10, said method comprising the steps of:

lapping or sand blasting at least one of front and back surfaces of a planar shape synthetic quartz glass member, etching the lapped or sand blasted surface into the rough surface for yielding the window member, mounting an optical device within a receptacle, and integrating the window member with the receptacle.

17. A method for preparing an optical device package comprising the convex shape window member of claim 11, said method comprising the steps of:

attaching a stereo-mask of convex shape to one surface of a planar shape synthetic quartz glass member, sand blasting the one surface of synthetic quartz glass together with the mask, for transferring the convex shape of the mask to the synthetic quartz glass, etching the sand blasted surface into the rough surface for yielding the window member, mounting an optical device within a receptacle, and integrating the window member with the receptacle.

18. The method of claim 16 wherein the optical device is a light-emitting device.

19. The method of claim 18 wherein the optical device emits light of wavelength up to 300 nm.

20. The window member of claim 1 wherein the rough surface has a surface roughness (Ra) of 0.2 to 0.5 μm.

21. The window member of claim 1 wherein one of the front and back surfaces is the rough surface and the other is a mirror surface.

22. The window member of claim 21 wherein the mirror surface has a surface roughness (Ra) of up to 0.05 μm.

* * * * *